US 6,611,701 B2

(12) United States Patent
Foo

(10) Patent No.: US 6,611,701 B2
(45) Date of Patent: Aug. 26, 2003

(54) METHOD AND APPARATUS FOR FAST BREATH-HELD 3D MR DATA ACQUISITION USING VARIABLE SAMPLING

(75) Inventor: Thomas K. F. Foo, Rockville, MD (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 326 days.

(21) Appl. No.: 09/681,091

(22) Filed: Dec. 30, 2000

(65) Prior Publication Data
US 2002/0087068 A1 Jul. 4, 2002

(51) Int. Cl.$^7$ ................................................. A61B 5/05
(52) U.S. Cl. .................................................... 600/413
(58) Field of Search ............................ 600/413, 410, 600/411, 412, 419; 324/307, 308, 309; 436/173

(56) References Cited

U.S. PATENT DOCUMENTS

| 5,329,925 | A | * | 7/1994 | NessAiver | 600/413 |
|---|---|---|---|---|---|
| 5,377,680 | A | * | 1/1995 | Bernstein et al. | 600/413 |
| 5,435,303 | A | * | 7/1995 | Bernstein et al. | 600/413 |
| 5,545,992 | A | * | 8/1996 | Foo | 324/309 |
| 5,657,758 | A | * | 8/1997 | Posse et al. | 600/413 |
| 5,997,883 | A | * | 12/1999 | Epstein et al. | 324/306 |
| 6,377,831 | B1 | * | 4/2002 | Seshan et al. | 600/407 |
| 6,434,412 | B1 | * | 8/2002 | Simonetti et al. | 600/410 |
| 6,526,307 | B2 | * | 2/2003 | Foo | 600/413 |

OTHER PUBLICATIONS

Alley MT, Napel S, Amano Y, Paik DS, Shifrin RY, Shimakawa, A. Pelc NJ, Herfkens, RJ Fast 3D cardiac cine MR imaging. J Magn Reson Imaging 1999; 9: 751–5.

Wielopolski PA, van Geuns Rj, de Feyter PJ, Oudkerk M. Breath–hold coronary MR angiograpy with volume–targeted imaging. Radiology 1998; 209–19.

Doyle M, Walsh EG, Blackwell GG, Pohost GM. Block regional interpolation scheme for k–space (BRISK): a rapid cardiac imaging technique. Magn Reson Med 1995; 33: 163–70.

Doyle M, Walsh EG, Foster RE, Pohost GM. Rapid cardiac imaging with turbo BRISK. Magn Reson Med 1997; 37: 410–7.

* cited by examiner

Primary Examiner—Daniel Robinson
(74) Attorney, Agent, or Firm—Ziolkowski Patent Solutions Group, PLLC; Michael A. Della Penna; Carl B. Horton

(57) ABSTRACT

A method and apparatus are disclosed for quickly acquiring MR cardiac images in a time equivalent to a single breath-hold. MR data acquisition is partitioned into at least low and high spatial frequency views and segmented within each of the partitions such that multiple segments of MR data are acquired from each phase of the cardiac cycle for the low and high spatial frequency views. Acquisition of MR data in the low spatial frequency views is performed relatively more often than the acquisition of MR data in the high spatial frequency views. MR images are reconstructed using this variable temporal k-space sampling technique to produce volume images of the heart within a single breath-hold. Images can be acquired throughout the cardiac cycle at both diastole and systole that can be used for measuring ventricular volumes and ejection fractions. Single phase volume acquisitions can also be performed to assess myocardial infarction.

29 Claims, 5 Drawing Sheets

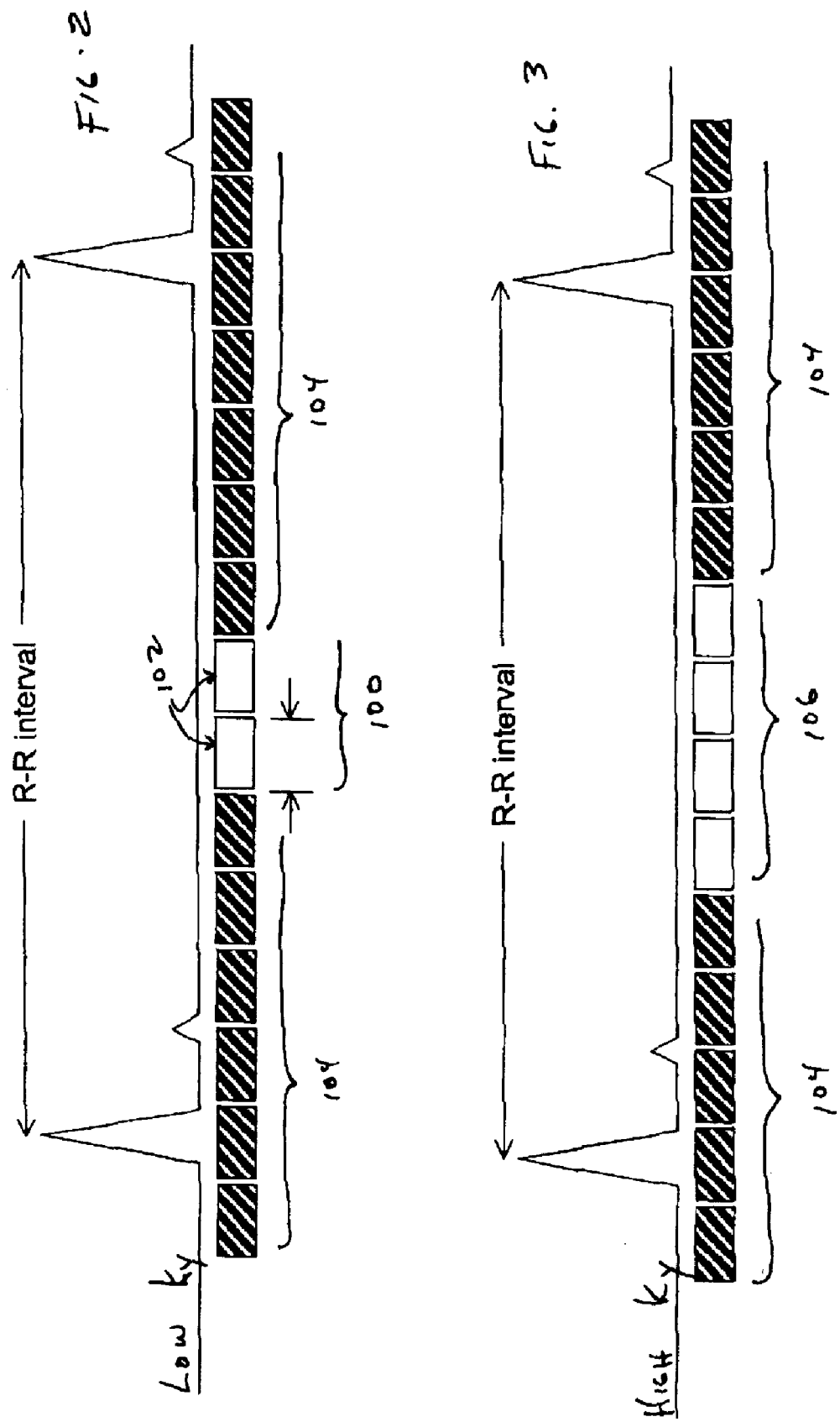

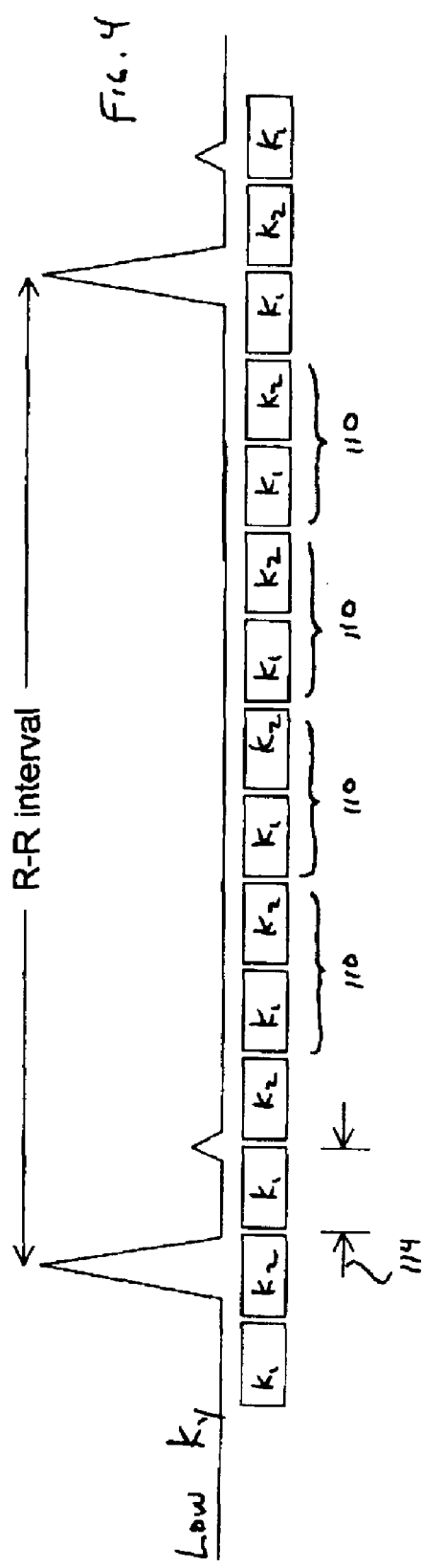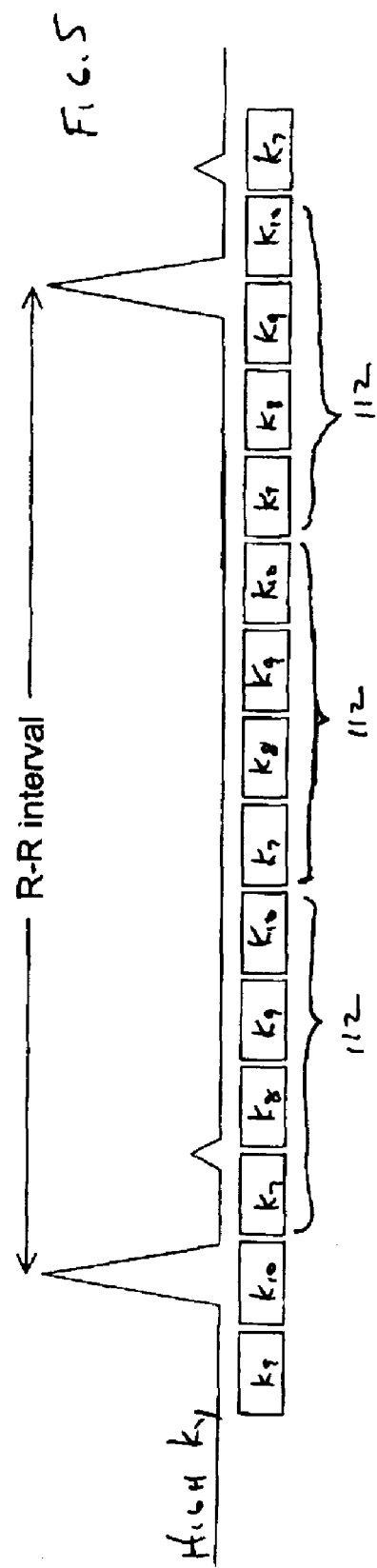

METHOD AND APPARATUS FOR FAST BREATH-HELD 3D MR DATA ACQUISITION USING VARIABLE SAMPLING

BACKGROUND OF INVENTION

The present invention relates generally to magnetic resonance imaging (MRI), and more particularly, to a method and apparatus to acquire cardiac-gated images in near-single-breath-hold times.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

In imaging the heart, one has to contend with both respiratory motion and cardiac motion. The former being best controlled using a breath-held technique or some manner of respiratory compensation. Single-shot magnetic resonance imaging using Echo Planar Imaging (EPI) techniques are able to acquire an image in 50–100 msec, thereby eliminating cardiac motion artifacts, but result in low spatial resolution and image signal-to-noise ratio. Moreover, it is well known in the art that single-shot EPI acquisitions (including single shot spiral acquisitions) suffer from off-resonance effects which is manifested by either spatial distortion (with rectilinear read-out) or spatial blurring (with spiral acquisitions).

Spatial resolution and image signal-to-noise ratio (S/N) is restored by segmenting the acquisition over several cardiac cycles. In order to minimize the image blurring as the result of cardiac motion over several cardiac cycles, the segmented acquisition approach gates data acquisition such that data for the desired image is acquired over a small temporal window within each cardiac cycle and gated such that the acquisition occurs at the same phase of the cardiac cycle over subsequent acquisitions. The partitioning or segmentation of the data acquisition over several cardiac cycles is often referred to as a segmented k-space acquisition.

Such acquisition techniques yield images with high image signal-to-noise ratio and high spatial resolution. By keeping the data acquisition window within each cardiac cycle short, cardiac motion blurring over this temporal window is minimized. However, the trade-off here is that a smaller acquisition window implies greater segmentation where all necessary data required to reconstruct an image is spread out over a larger number of cardiac cycles and increases the breath-hold period (scan time). With two-dimensional image acquisition using gated segmented k-space techniques, acquisition windows of between 50–100 msec have been used for scan times of between 12–20 seconds.

Obviously, with three-dimensional imaging, the amount of data is substantially increased due to the need to spatially encode for the third slice direction. Hence, for images at the same in-plane spatial resolution as in a two-dimensional acquisition, the total scan time is increased by a factor equal to the number of slice partitions in the three-dimensional volume. As a result, using the same acquisition parameters as the two-dimensional acquisition renders the scan time of a three-dimensional acquisition to exceed a single breath-hold time for a typical patient suffering from cardio-vascular disease.

In current three-dimensional cardiac imaging, due to the longer scan times, data acquisition is either respiratory-gated or breath-held using segmented echo planar imaging (EPI). If respiratory-gated, 3D CINE images are acquired over several minutes, and the quality of the data acquisition is dependent on the patient maintaining a relatively stable respiration pattern over a period of 6–10 minutes. The current state-of-the-art in breath-held 3D acquisitions is often characterized by low spatial resolution and only a single phase of the cardiac cycle is acquired. The acquisition period has been reported to be between 20 and 40 seconds. Volumetric imaging is accomplished by acquiring data over several different breath-hold periods and combining the data acquisitions. However, after reconstructing images with data acquired over different breath-hold periods, temporal and spatial discrepancies and inaccuracies can occur, resulting in images that are not well defined and/or blurred. Moreover, in order to attain these shorter scan times, the acquisition window in the current 3D acquisitions are often long. Thus, the need to accommodate a shorter breath-hold period leads to increased spatial blurring from cardiac motion as a direct consequence of a larger data acquisition window within each cardiac cycle.

In addition, respiratory-gated techniques using navigator echoes for monitoring the respiratory motion do not lend themselves to a multi-phase or CINE acquisition as a separate pulse sequence section must also be played out within each cardiac interval to interrogate the displacement of the diaphragm. Furthermore, the acquisition of data for the different cardiac phases may not necessarily be at the same respiratory phase, leading to mixed image quality where some phase images closer to when the navigator echo segment was executed having better image quality than that more distant in time.

Some uses of gated acquisitions are in the evaluation of cardiac wall mass and ventricular ejection fractions. With current two-dimensional acquisition schemes, several parallel two-dimensional acquisitions covering the heart are made. From this data set, a simple integration scheme (e.g., Simpson's rule) is used to calculate volumetric data in the third dimension. Moreover, the two-dimensional acquisition techniques require that each slice be obtained in a single breath-hold. Therefore, to cover the entire heart in a short-access view, between 8–12 breath-holds are needed. Faster 2D techniques, using EPI, increases the acquisition time, but image quality suffers. In addition, the patient may be at a different breath-hold position for each acquisition and this can lead to error in the final measurements.

It would therefore be advantageous to have a technique in which a fast 3D acquisition could be accomplished in a single breath-hold.

SUMMARY OF INVENTION

The present invention relates to a technique for acquiring cardiac MR images in a time at least equivalent to a typical breath-hold using a variable temporal k-space sampling technique that solves the aforementioned problems. This fast, single breath-hold 3D acquisition can not only be used in a CINE (multi-phase) acquisition for the diagnosis of cardiac wall motion abnormalities, evaluation of ventricular end-diastolic and end-systolic volumes, but also in a single phase mode with magnetization preparation (such as an inversion recovery rf pulse) for the evaluation of myocardial infarction or in coronary artery angiography.

The present invention includes a three-dimensional acquisition technique that employs variable temporal sampling of 3D k-space to produce volume images of the heart within a reasonable breath-hold period. By performing an ECG-gated 3D single phase or multi-phase acquisition (3D CINE) of the heart using fast gradient-recalled echo (GRE) or steady-state free-precession (SSFP-FIESTA) pulse sequences, volumetric images can be generated during a time equivalent to a reasonable single breath-hold with minimal temporal and spatial discrepancies or inaccuracies as compared to images acquired over several different breath-hold periods.

In accordance with one aspect of the invention, a method of acquiring MR images includes partitioning MR data acquisition into at least low and high spatial frequency view partitions, and segmenting MR data acquisition in each of the partitions. The method includes acquiring multiple segments of MR data from each phase of a cardiac cycle in the low spatial frequency view partition, and acquiring multiple segments of MR data from each phase of the cardiac cycle in the high spatial frequency view partitions. Preferably, the acquisition of MR data in the low spatial frequency view partitions is performed relatively more often as compared to the acquisition of MR data in the high spatial frequency view partition. This permits a smaller acquisition window during the acquisition of the low spatial frequency data to minimize cardiac motion blurring artifacts. An MR image is then reconstructed with the MR data acquired from each of the low and high spatial frequency view partitions with reduced temporal and spatial inaccuracies.

In accordance with other aspects of the invention, a computer system and a computer program are disclosed for use with imaging apparatus to acquire data and images. The data acquisition is partitioned into low and high spatial frequency view partitions, and optionally additionally partitioned into an intermediate spatial frequency. The spatial frequency data can be partitioned either along the phase encoding ($k_y$) direction, or both the phase encoding ($k_y$) and slice encoding ($k_z$) direction. In the latter case, the segmentation would be in the radial spatial frequency in the $k_y$–$k_z$ plane. MR data acquisition is segmented in each of the partitions such that multiple segments of data are acquired in each phase of a cardiac cycle in the low and high spatial frequency view partitions. An MR image is reconstructed with the MR data acquired from each of the low and high spatial frequency view partitions.

By using such a variable temporal k-space sampling technique, these gated 3D acquisitions can produce volumetric images of the heart within a reasonable breath-hold period. Cardiac images can be acquired at both diastole and systole to thereby facilitate a fast, single breath-hold technique for the measurement of ventricular volumes and ejection fractions without the discrepancies and inaccuracies that typically occur when images are acquired over several different breath-hold periods.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention. In the drawings:

FIGS. 2 and 3 show a data acquisition scheme in accordance with one embodiment of the present invention.

FIGS. 4 and 5 show a data acquisition scheme in accordance with another embodiment of the present invention.

DETAILED DESCRIPTION

Figure 1:
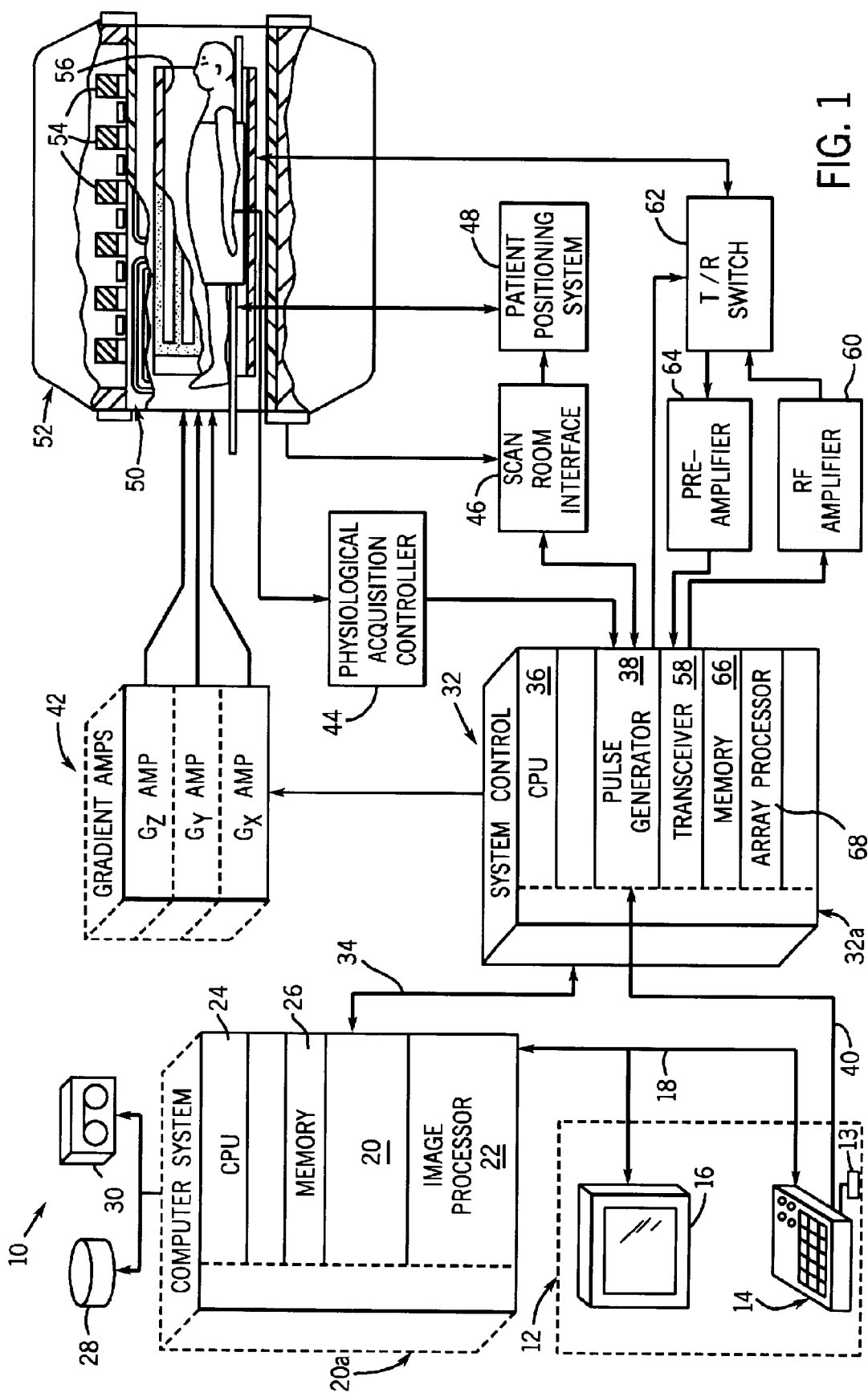
FIG. 1 is a schematic block diagram of an NMR imaging system for use with the present invention.

Referring to FIG. 1, the major components of a preferred MRI system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to a disk storage 28 and a tape drive 30 for storage of image data and programs, and it communicates with a separate system control 32 through a high speed serial link 34. The input device 13 can include a mouse, joystick, keyboard, track ball, touch screen, light wand, voice control, or similar device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator which indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 also receives patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in an assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58.

The transmit/receive switch 62 is controlled by a signal from the pulse generator module 38 to electrically connect the RF amplifier 60 to the coil 56 during the transmit mode and to connect the preamplifier 64 during the receive mode. The transmit/receive switch 62 also enables a separate RF coil (for example, a surface coil) to be used in either the transmit or receive mode.

The MR signals picked up by the RF coil 56 are digitized by the transceiver module 58 and transferred to a memory module 66 in the system control 32. When a scan is completed, an array of raw k-space data has been acquired in the memory module 66. As will be described in more detail below, this raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in the disk memory 28. In response to commands received from the operator console 12, this image data may be archived on the tape drive 30, or it may be further processed by the image processor 22 and conveyed to the operator console 12 and presented on the display 16.

The present invention includes a method and system suitable for use with the above-referenced NMR system, or any similar or equivalent system for obtaining MR images.

In order to minimize cardiac motion blurring, it is advantageous to maintain a short acquisition window within each cardiac cycle in gated-3D volume acquisitions. Additionally, the total scan time must be short to allow for a reasonable breath-hold period. For example, a typical 256×192 partial Fourier acquisition of 16 slice partitions would require a total scan time of approximately 112 heartbeats assuming that all 16 slices including views are acquired within each R-R cardiac interval. That is, for each cardiac interval, 16 separate data acquisitions occur within a small temporal window with each separate data acquisition at a different slice encoding ($k_z$) values with the same phase encoding value ($k_y$). During the next cardiac interval, the phase encoding value ($k_y$) is incremented and the data acquisition repeats for all the slice encoding ($k_z$) values. This continues until all necessary data are acquired. The present invention utilizes a variable temporal k-space sampling scheme in order to reduce this acquisition time to within approximately 16–26 heartbeats, which is a time period more amenable for a single breath-hold. The total scan time is reduced by acquiring low $k_y$ spatial frequency views more often than high $k_y$ spatial frequency views.

The present technique includes the use of a short acquisition window for the low $k_y$ spatial frequency views and a much longer acquisition window for the high $k_y$ spatial frequency views.

FIGS. 2 and 3 show an implementation of the variable temporal k-space sampling scheme of the present invention in a single phase 3D CINE acquisition. As indicated, FIG. 2 shows the acquisition of the low $k_y$ spatial frequency views and FIG. 3 shows the acquisition of the high $k_y$ spatial frequency views. In this manner, the MR data acquisition is partitioned into at least low and high spatial frequency view partitions. FIG. 2 shows implementation of a short acquisition window 100 for the low $k_y$ spatial frequency views, where each data acquisition segment 102 has an associated single phase encode value and $n_z$ slice encodes such that the acquisition time is equal to $n_z$ times the repetition time (TR). The short acquisition window 100 is preceded by, and followed by, a series of dummy rf excitations 104. FIG. 3 shows the acquisition of the high spatial frequency data that is later combined with the low spatial frequency data of FIG. 2 to reconstruct an image. FIG. 3 shows a much longer acquisition window 106 for the high $k_y$ spatial frequency views. As indicated by FIGS. 2 and 3, in a preferred embodiment, during the acquisition of the low spatial frequency views, 2–3 full z-slice encoding loops of 12–16 partitions each are acquired in the cardiac interval. For the higher k-space views, 4–5 full z-slice encoding loops are acquired. If the cut-off is assumed to be the central 32 $k_y$ encoding views, the total scan time, given in terms of a number of heartbeats, is given by:

$$T\_scan = ((pe\_lim/pe\_acq1) + (yres*NEX(pe\_lim/2))/pe\_acq2), \quad \text{Eqn. 1}$$

where pe_acq1 and pe_acq2 are the number of z-loops acquired for the low and high spatial frequency views per R-R interval, respectively, and pe_lim is the number of $k_y$ views assumed to be in the low spatial frequency region. It is noted that Eqn. 1 assumes a partial Fourier acquisition. For an example of a 256×192 partial Fourier acquisition, the total scan time is 36 heartbeats pe_$_{acq}$1=2 and pe_acq2=2 per R-R interval (and pe_lim=32). The acquisition window for the low k-space views was about 80 ms (pe_acq1=2), while that for the high k-space views was 160 ms (pe_$_{acq}$2=4), assuming a TR time of 3.4 msec and 12 slice partitions. A greater reduction in scan time can be realized if a larger acquisition window is used.

FIGS. 4 and 5 show the present invention applied in a multi-phase breath-held 3D-CINE acquisition. As shown in FIG. 4, in a preferred embodiment, data from 2 $k_y$ phase encodes 110 are acquired for the low spatial frequency views, and as shown in FIG. 5, data from 4 $k_y$ phase encodes 112 are acquired for the high spatial frequency views. As previously explained with reference to FIGS. 2 and 3, the acquisition time 114 of each data acquisition segment is the product of the $n_z$ slice encodes by the repetition time TR. Once the data is acquired, it is then interpolated retrospectively in a known manner to produce images at multiple temporal points in the cardiac cycle to reconstruct images that have both minimized image blurring and acquisition time as compared to images acquired over several different breath-hold periods.

The present invention includes implementation of a variable sampling scheme to achieve the fast 3D acquisition. This can be accomplished using a number of different techniques, two of which will be described in detail.

Once such technique includes an extension and expansion of the BRISK technique as described in: Block Regional Interpolation Scheme for k-Space (BRISK): A Rapid Cardiac Imaging Technique; Doyle, M. et al., *Magnetic Resonance Medicine* 1995; 33: 163–170; and Rapid Cardiac Imaging With Turbo BRISK.; Doyle, M. et al., *Magnetic Resonance Medicine* 1997; 37: 410–7. However, unlike the BRISK technique, the present invention does not rely on an assumption that the high spatial frequencies are static, and does not require that the data be re-sampled in the time domain after zero filling and Fourier transforming the data to k-space. It is also noted that the original BRISK technique was limited to 2D acquisition strategies.

Figure 6:
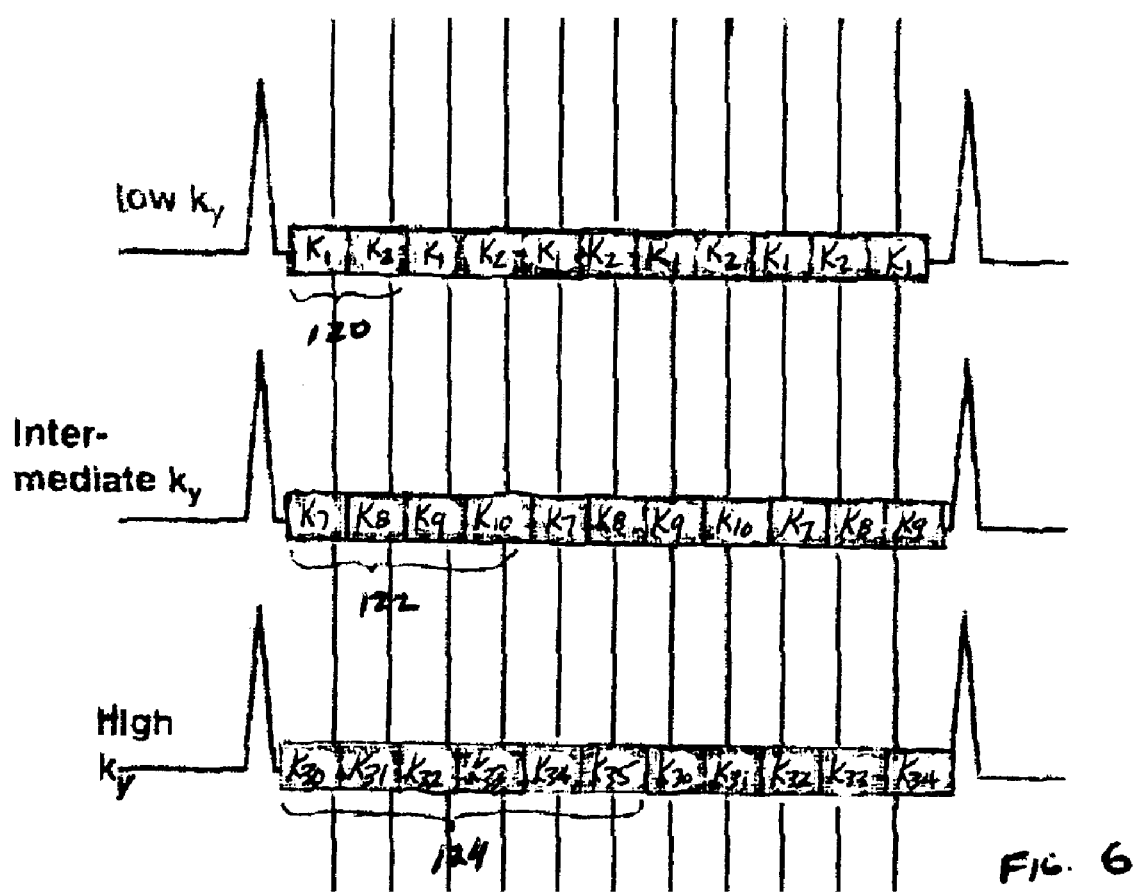
FIG. 6 shows a data acquisition scheme in accordance with yet another embodiment of the present invention.

FIG. 6 shows another embodiment of the 3D breath-hold CINE acquisition scheme of the present invention, but with partitioning of the MR data acquisition into low $k_y$, intermediate $k_y$, and high $k_y$ spatial frequency view partitions. In this example, a rectilinear sampling scheme in $k_y$ is shown. For each $k_y$ block, all $n_z$ slice encodes are acquired. For the low spatial frequency views, the R-R interval is sampled more often than the intermediate $k_y$ spatial frequency views, and the intermediate $k_y$ spatial frequency views are sampled more often than the high $k_y$ spatial frequency views. Data from all segments are then interpolated to the same temporal locations as indicated by the dashed lines before image reconstruction. In this specific example, 2 $k_y$ views 120 are acquired for the low spatial frequency views, 4 $k_y$ views 122 are acquired for the intermediate spatial frequency views, and 6 $k_y$ views 124 are acquired for the high spatial frequency views. That is, after partitioning the MR data acquisition into the low, intermediate, and high spatial frequency view partitions, the invention also includes segmenting MR data acquisition in each of the partitions. The invention then includes acquiring multiple segments of MR data from each phase of the cardiac cycle from the low, intermediate, and high spatial frequency view partitions. Data is then interpolated from all the segments to the same temporal locations to reconstruct the MR image.

As shown in the rectilinear example of FIG. 6, the low spatial frequencies $k_y$ are sampled relatively often, as compared to the intermediate and high spatial frequencies. In this example, a segment of 2 $k_y$ views are acquired in each R-R interval for $k_y < k_{y\_lim1}$, where $k_{y\_lim1}$ is a threshold limit for the low k-space views. The acquisition scheme is further segmented such that 4 $k_y$ lines are acquired for the intermediate k-space views for $k_{y\_lim1} < k_y < k_{y\_lim2}$, where $k_{y\_lim2}$ is the upper limit for the intermediate k-space views and 6 $k_y$ lines are acquired per R-R interval for $k_y > k_{y\_lim2}$. In this scheme, each segment of n $k_y$ lines are repeated acquired per R-R interval, thus sampling the motion of the cardiac cycle with different rates depending on the spatial frequency of the acquisition. Note that in the rectilinear sampling case, each $k_y$ line includes all the $k_z$ slice encoding lines. Hence, for each segment, the acquisition window is:

$$T_{acq} = (n_z) \times (n_{y\_acq}) \times (TR), \qquad \text{Eqn. 2}$$

where $n_z$ is the number of slice partitions, $n_{y\_acq}$ is the number of $k_y$ views per segment and is a function of $k_y$ spatial frequency, and TR is the sequence repetition time.

Temporal information is obtained by interpolation of the variable sampled data for the different segments into equal temporal phases as in a conventional CINE acquisition except that the data is interpolated into temporal 3D volumes. Furthermore, the interpolation is different for the different $k_y$ segments to account for the different in temporal sampling as a function of $k_y$.

In another embodiment, rather than having all $k_z$ views acquired in each segment, the data acquisition and sampling is ordered based in both the $k_y$ and $k_z$ spatial encoding views. Thus, different data acquisition periods, $T_{acq}(k_r)$ are specified as a function of the radial distance from the spatial frequency origin. The data acquisition period is short for the low spatial frequency views, and longer for the higher spatial frequency views, based on the radial distance (magnitude) of the encoding value from the origin, as given by: $k_y = \sqrt{(k_y^2 + k_y^2)}$ Limits for the low spatial frequencies, intermediate spatial frequencies, and the high spatial frequencies can be set similar to that described for the rectilinear sampling scheme. Temporal interpolation of the data is performed individually for each $k_y$ and $k_z$ encoding data point. Since the interpolation is a linear operation, the interpolation order (i.e., $k_y$ first or $k_z$ first) is interchangeable.

Figure 7:
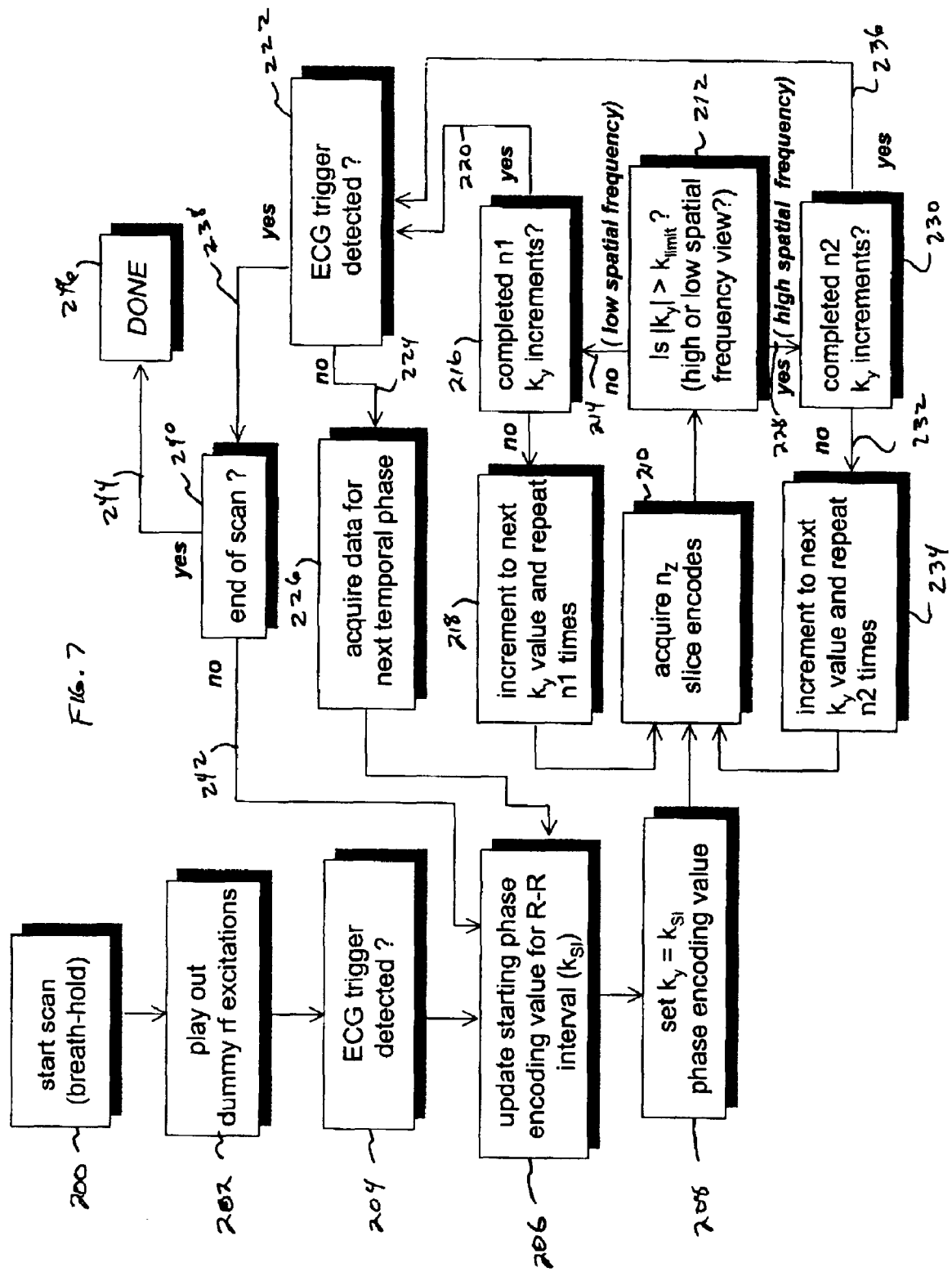
FIG. 7 is a flow chart descriptive of data acquisition according to a process of the present invention and for implementing the present invention in a computer program.

Referring now to FIG. 7, a flow chart for the present technique is disclosed. A breath-hold scan starts at 200, and if a single phase acquisition is desired, a series of dummy rf excitations are transmitted 202, and after an ECG-trigger is detected 204, the starting phase encoding value for the R-R interval is updated 206 based on the ECG-trigger detected at 204. The phase encoding value is then set for this acquisition sequence 208 and after acquiring $n_z$ slice encodes 210 the absolute value of $k_y$ is checked against a k-space limit at 212 to determine if low or high spatial frequency view data is being acquired 212. If low spatial frequency view data is being acquired 214, the system checks to see whether the number of phase encoding values n1 to be acquired for low spatial frequency views has been acquired 216, and if not, $k_y$ is incremented to the next $K_y$ value and the sub-process is continued until n1 views are acquired 216, 220, at which time the system checks for an ECG-trigger at 222. If an ECG-trigger is not detected 222, 224, the system then moves to acquire data for the next temporal phase 226.

If the system is acquiring the slice encodes for the high spatial frequency 212, 228, the system checks to see whether $k_y$ has been incremented indicating that the number of phase encoding values n2 to be acquired for the high spatial frequency views is complete 230, and if it is not, 232, it is incremented to the next $k_y$ value 234 and $n_z$ slice encodes are acquired 210 n2 times. After all the high spatial frequency view data has been acquired 230, 236 the system checks for the ECG-trigger 222 and continues to acquire data for the next temporal phase 226, unless an ECG-trigger is detected 222, 238. If the scan is not yet complete 240, 242, the system returns to updating the starting phase encoding value for the R-R interval at 206 and continues to acquire data as previously described. The system continues to loop until the end of the scan 240, 244, at which time the algorithm is complete 246.

Accordingly, aforementioned technique is implemented in a computer program, and run on a computer system to control an imaging device, such as that described with reference to FIG. 1. The apparatus and method of the present invention is capable of obtaining a series of images, each of a different phase of the cardiac cycle in a 3D volume in a single breath-hold with high image S/N. The advantage of a 3D acquisition is the ability to reformat images of the heart and generate data that is ideal for a 3D rendering of the ventricular volume, which is particularly advantageous for more accurate volumetric and functional analysis of cardiac output.

The present invention has been described in terms of the preferred embodiment, and it is recognized that equivalents, alternatives, and modifications, aside from those expressly stated, are possible and within the scope of the appending claims.

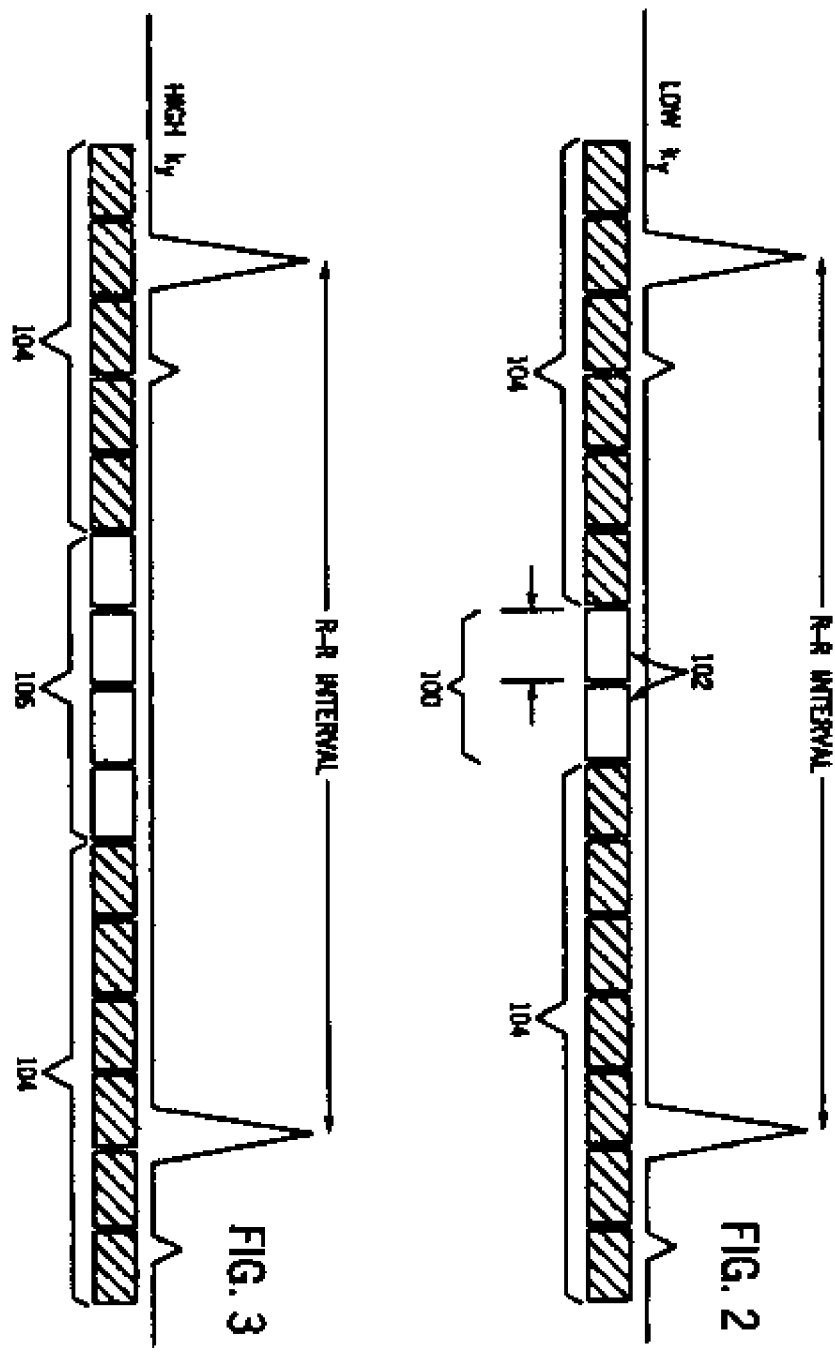

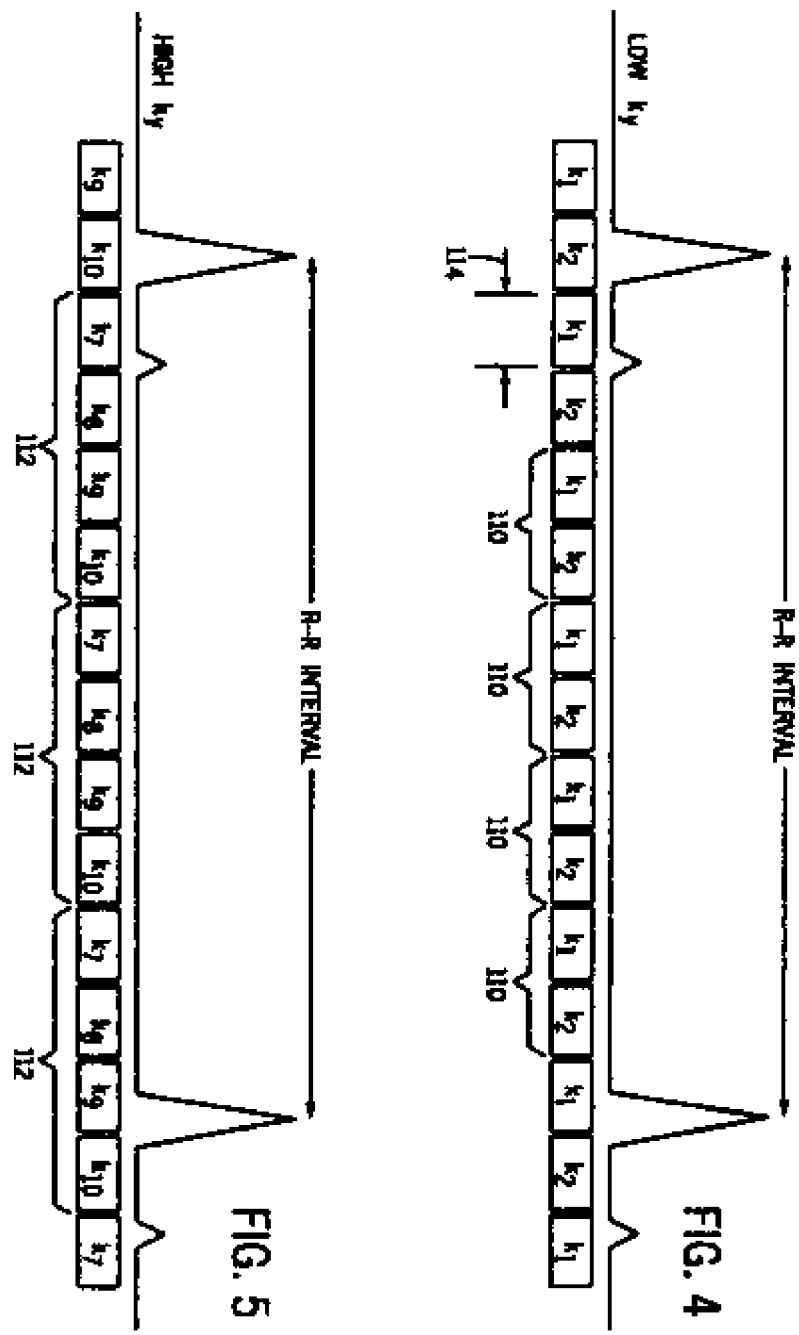

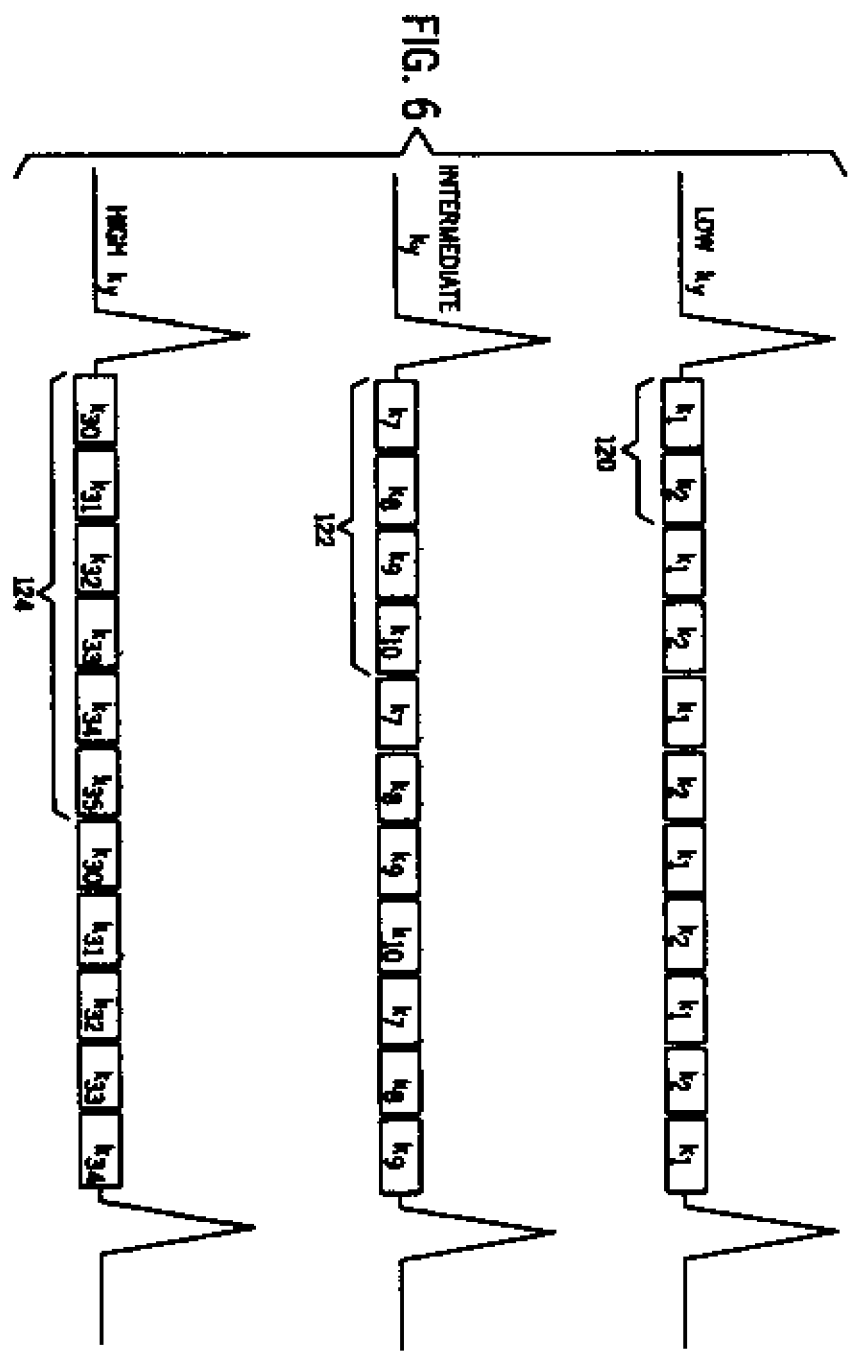

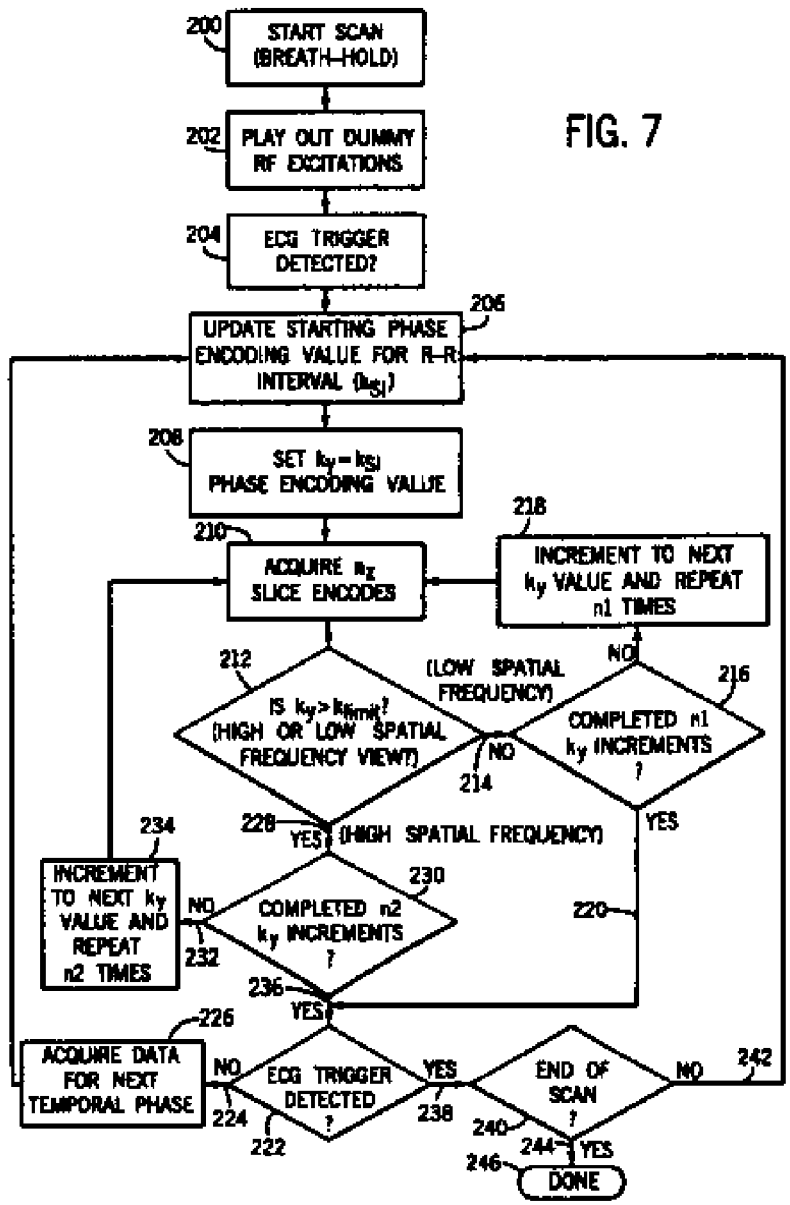

What is claimed is:

1. A method of MR image acquisition comprising:
   partitioning MR data acquisition into at least low and high spatial frequency view partitions;
   segmenting MR data acquisition in each of the partitions;
   acquiring multiple segments of MR data from each phase of a cardiac cycle in the low spatial frequency view partition;

acquiring multiple segments of MR data from each phase of the cardiac cycle in the high spatial frequency view partition, and reconstructing an MR image with MR data acquired from each of the low and high spatial frequency view partitions.

2. The method of claim 1 wherein the steps of acquiring multiple segments of MR data is further defined as acquiring a first number of segments in the low spatial frequency view partition and a second number of segments in the high spatial frequency view partition.

3. The method of claim 2 wherein the first number is less than the second number.

4. The method of claim 1 further comprising:

partitioning MR data acquisition into low, intermediate, and high spatial frequency view partitions; and segmenting MR data acquisition such that additional segments are acquired in each of the low, intermediate and high spatial frequency view partitions, respectively.

5. The method of claim 1 further comprising reconstructing a volume image of a cardiac region of a patient during a single breath-hold.

6. The method of claim 1 wherein the image data is acquired in a breath-hold time under 30 heartbeats.

7. The method of claim 5 wherein the volume image includes a cardiac acquired at either one of diastole and systole.

8. The method of claim 1 further comprising measuring ventricular volumes and ejection fractions from the reconstructed images.

9. The method of claim 1 wherein 3D MR data is acquired and the image reconstructed is a 3D image.

10. The method of claim 1 wherein MR data is acquired using a 3D CINE breath-held acquisition technique.

11. The method of claim 1 wherein MR data is acquired using one of a fast gradient-recalled echo pulse sequence and a steady-state free precession pulse sequence.

12. The method of claim 1 further comprising acquiring 2–3 full z-slice encoding loops of 12–16 sub-partitions each in the low spatial frequency view partition and acquiring 4–5 full z-slice encoding loops of 12–16 sub-partitions each in the high spatial frequency view partition.

13. An MRI apparatus to acquire cardiac images in near single breath-hold times comprising:

a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and a computer programmed to:
partition MR data acquisition into at least low and high spatial frequency view partitions;
segment MR data acquisition in each of the partitions;
acquire multiple segments of MR data from each phase of a cardiac cycle in the low spatial frequency view partition;
acquire multiple segments of MR data from each phase of the cardiac cycle in the high spatial frequency view partition; and
reconstruct an MR image with MR data acquired from each of the low and high spatial frequency view partitions.

14. The apparatus of claim 13 wherein acquisition of MR data in the low spatial frequency view partition is performed relatively often as compared to acquisition of MR data in the high spatial frequency view partition.

15. The apparatus of claim 1 wherein data is acquired rectilinearly.

16. The apparatus of claim 13 wherein the computer is further programmed to repeatedly acquire each segment of $k_y$ lines per R-R interval to sample a cardiac cycle with different rates dependent on spatial frequency of an acquisition.

17. The apparatus of claim 13 wherein a segment of $n_L k_y$ views are acquired in each R-R interval for the low spatial frequency view partition, and $n_H k_y$ views are acquired in each R-R interval for the high spatial frequency view partition, where $n_L < n_H$.

18. The apparatus of claim 13 wherein the computer is further programmed to acquire data with respect to both $k_y$ and $k_z$ spatial encoding views such that data acquisition periods are based on a function of radial distance from a spatial frequency origin.

19. The apparatus of claim 18 wherein a data acquisition period is shorter for the low spatial frequency view partition and longer for the high spatial frequency view partition.

20. The apparatus of claim 19 wherein a segment of $n_L k_y$ views are acquired in each R-R interval for the low spatial frequency view partition, and $n_H k_y$ views are acquired in each R-R interval for the high spatial frequency view partition, where $n_L < n_H$.

21. The apparatus of claim 13 wherein the MR data is partitioned into low, intermediate, and high frequency view partitions; and within the low frequency view partition, MR data is acquired in $n_L k_y$ views for each R-R interval for $k_y \leq k_{y\_lim1}$, where $k_{y\_lim1}$ is an upper threshold limit in the low spatial frequency view partition; and within the intermediate frequency view partition, MR data is acquired in $n_I k_y$ views for each R-R interval for $k_{y\_lim1} \leq k_y \leq k_{y\_lim2}$, where $k_{y\_lim2}$ is an upper threshold limit in the intermediate spatial frequency view partition, and within the high frequency view partition, MR data is acquired in $n_H k_y$ views for each R-R interval for $k_y > k_{y\_lim2}$.

22. A computer program to control a medical imaging scanner, the computer program having instructions to control a computer to:

partition MR data acquisition into at least low and high spatial frequency view partitions;

segment MR data acquisition in each of the partitions;

acquire multiple segments of MR data from a cardiac cycle in the low and high spatial frequency view partitions; and reconstruct an MR image with MR data acquired from the low and high spatial frequency view partitions.

23. The computer program of claim 22 wherein the computer is further programmed to:

acquire a first number of segments in the low spatial frequency view partition and a second number of segments in the high spatial frequency view partition; and wherein the first number is less than the second number.

24. The computer program of claim 22 wherein the computer is further programmed to:

partition MR data acquisition into low, intermediate, and high spatial frequency view partitions; and segment MR data acquisition such that additional segments are acquired in each of the low, intermediate and high spatial frequency view partitions, respectively.

25. The computer program of claim 22 wherein the computer is further programmed to reconstruct a volume image of a cardiac region of a patient during a single breath-hold and wherein the volume image includes a cardiac image acquired at either one of diastole and systole.

26. The computer program of claim 22 wherein the computer is programmed to:
   acquire 3D MR data using a 3D CINE breath-held acquisition technique and one of a past gradient-recalled echo pulse sequence and a steady-state free precession pulse sequence; and
   reconstruct a 3D image from the 3D MR data.

27. The computer program of claim 22 wherein the computer is further programmed to acquire 2–3 full z-slice encoding loops of 12–16 sub-partitions each in the low spatial frequency view partition and acquire 4–5 full z-slice encoding loops of 12–16 sub-partitions each in the high spatial frequency view partition.

28. The computer program of claim 22 wherein the computer is further programmed to acquire MR data by one of a rectilinear approach and as a function of radial distance from a spatial frequency origin.

29. The computer program of claim 22 wherein the computer is programmed to acquire data with regard to both $k_y$ and $k_z$ spatial encoding views such that data acquisition periods are based on a function of radial distance from a spatial frequency origin.

* * * * *

UNITED STATES PATENT AND TRADEMARK OFFICE
CERTIFICATE OF CORRECTION

PATENT NO. : 6,611,701 B2
DATED : August 26, 2003
INVENTOR(S) : Thomas K. F. Foo It is certified that error appears in the above-identified patent and that said Letters Patent is hereby corrected as shown below:

Drawings,
Replace Figs. 2-7, with the following:

Column 9,
Line 28, insert the word -- image -- before the word "acquired";

Signed and Sealed this

Twenty-first Day of December, 2004

JON W. DUDAS
*Director of the United States Patent and Trademark Office*

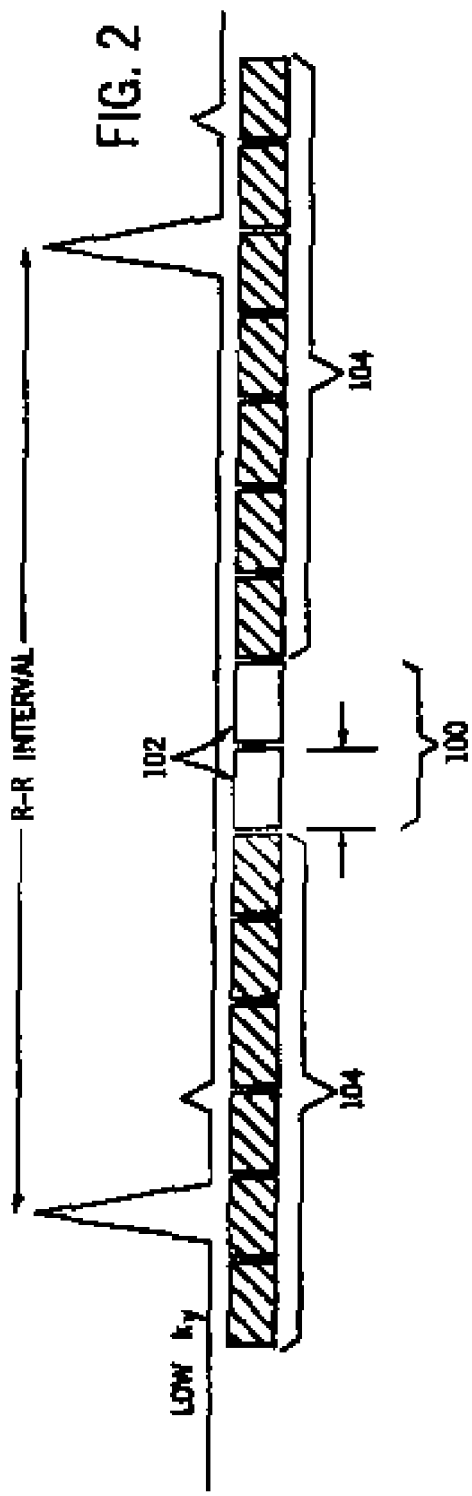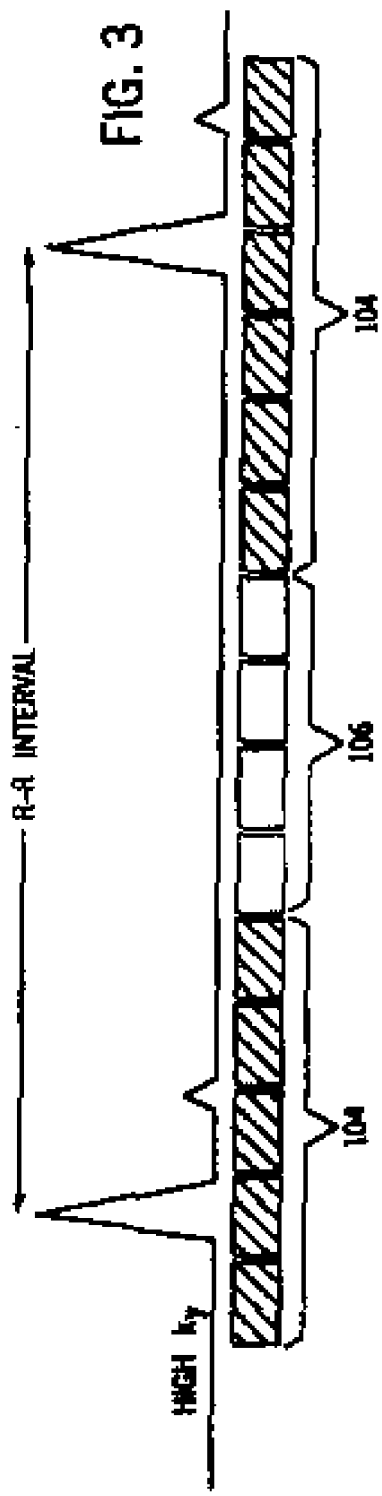

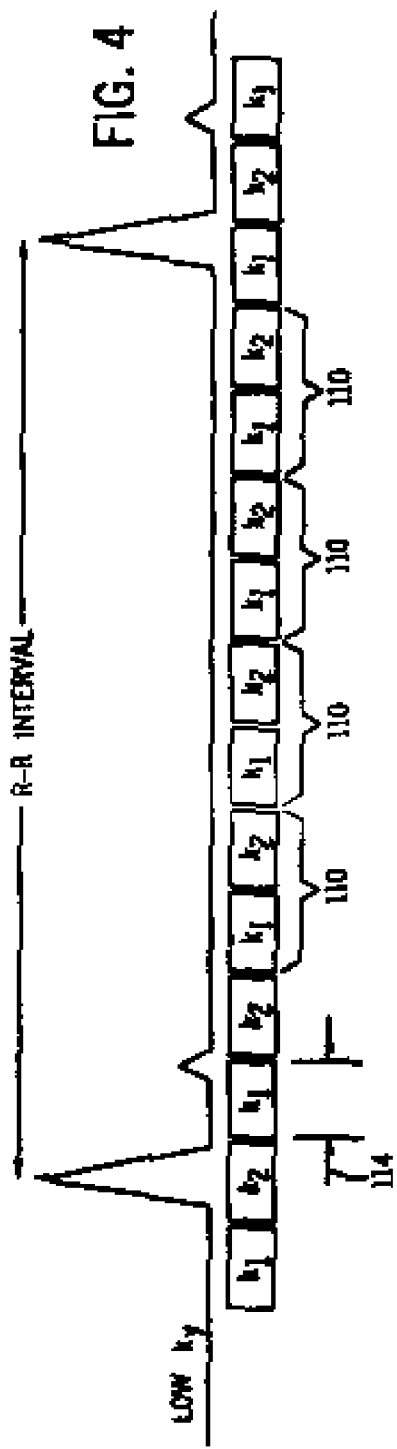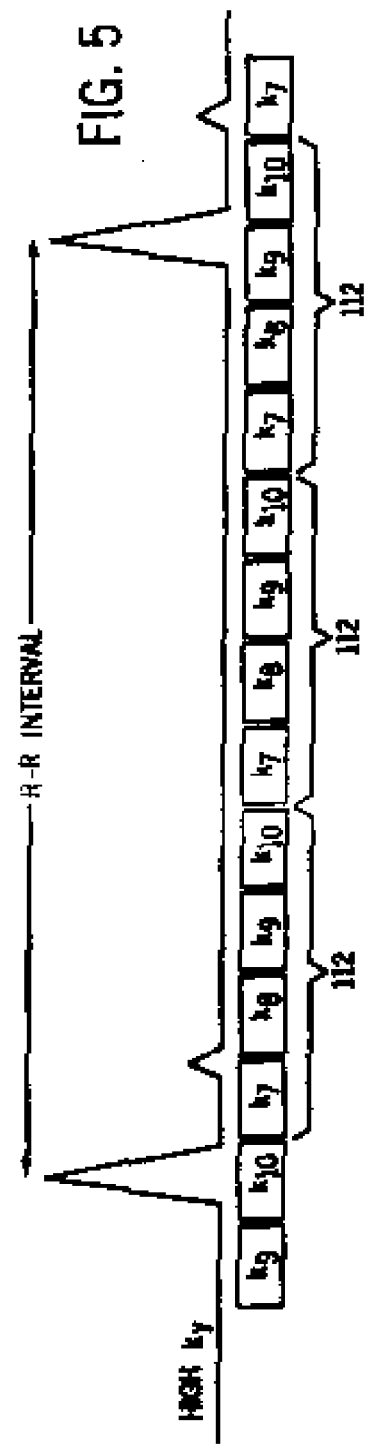

UNITED STATES PATENT AND TRADEMARK OFFICE
CERTIFICATE OF CORRECTION

PATENT NO. : 6,611,701 B2
DATED : August 26, 2003
INVENTOR(S) : Thomas K. F. Foo It is certified that error appears in the above-identified patent and that said Letters Patent is hereby corrected as shown below:

Drawings,
Replace Figs. 2-7 with the following:

Column 9,
Line 28, insert the word -- image -- before the word "acquired";

"

Signed and Sealed this

Eighth Day of February, 2005

JON W. DUDAS
*Director of the United States Patent and Trademark Office*